(12) United States Patent
Jackson et al.

(10) Patent No.: US 8,427,695 B2
(45) Date of Patent: Apr. 23, 2013

(54) SETTING OF IMAGING PARAMETERS

(75) Inventors: Michael K. Jackson, Richmond (CA); Kenneth V. Dyck, Burnaby (CA)

(73) Assignee: Eastman Kodak Company, Rochester, NY (US)

( * ) Notice: Subject to any disclaimer, the term of this patent is extended or adjusted under 35 U.S.C. 154(b) by 868 days.

(21) Appl. No.: 12/503,096

(22) Filed: Jul. 15, 2009

(65) Prior Publication Data

US 2011/0012984 A1    Jan. 20, 2011

(51) Int. Cl.
*H04N 1/40* (2006.01)
(52) U.S. Cl.
USPC .......................................... 358/1.18; 358/1.8
(58) Field of Classification Search ................ 358/1.9, 358/2.1, 494, 1.8, 3.2, 3.32, 1.18
See application file for complete search history.

(56) References Cited

U.S. PATENT DOCUMENTS

| | | | |
|---|---|---|---|
| 5,329,297 A | 7/1994 | Sanger et al. | |
| 5,546,165 A | 8/1996 | Rushing et al. | |
| 6,137,580 A | 10/2000 | Gelbart | |
| 6,529,616 B1 | 3/2003 | Rasmussen et al. | |
| 6,571,000 B1 | 5/2003 | Rasmussen et al. | |
| 6,663,206 B2 * | 12/2003 | Taylor | 347/9 |
| 6,710,795 B2 | 3/2004 | Sanger | |
| 6,819,352 B2 | 11/2004 | Mizes et al. | |
| 6,862,414 B2 | 3/2005 | Sampath et al. | |
| 7,038,802 B2 * | 5/2006 | Brady | 358/1.15 |
| 8,167,404 B2 * | 5/2012 | Mantell et al. | 347/41 |
| 2002/0196326 A1 | 12/2002 | Sanger | |
| 2003/0048326 A1 | 3/2003 | Yamasaki et al. | |
| 2007/0052991 A1 | 3/2007 | Goodman et al. | |
| 2007/0081841 A1 | 4/2007 | Nakano | |
| 2009/0066796 A1 | 3/2009 | Karasyuk et al. | |

FOREIGN PATENT DOCUMENTS

| | | |
|---|---|---|
| EP | 1 601 178 A2 | 11/2005 |
| WO | WO 2006/105667 A1 | 10/2006 |

* cited by examiner

*Primary Examiner* — Thomas D Lee
*Assistant Examiner* — Stephen M Brinich
(74) *Attorney, Agent, or Firm* — Nelson Adrian Blish

(57) ABSTRACT

A method for adjusting an imaging parameter includes operating a recording head (16) to form a first set of image features (60A) on a media (17). Image features in the first set are formed while the imaging parameter is set to a first predetermined value. The recording head forms a second set of image features (60B) on the media. Features in the second set are formed while the imaging parameter is set to a second predetermined value different from the first predetermined value. Image features of the first set are interleaved with image features of the second set to form an interleaved pattern of image features on the media. Data (47) from the interleaved pattern is generated and analyzed to determine a quantified value representative of banding in the interleaved pattern. The imaging parameters are adjusted based on the quantified value.

19 Claims, 7 Drawing Sheets

DETAIL A-A

SETTING OF IMAGING PARAMETERS

CROSS REFERENCE TO RELATED APPLICATIONS

Reference is made to commonly-assigned copending U.S. patent application Ser. No. 12/503,099 (now U.S. Publication No. 2011/0012985), filed Jul. 15, 2009, entitled IMPROVED SETTING OF IMAGE PARAMETERS USING A SCANNER, by Dyck et al., the disclosure of which is incorporated herein.

FIELD OF THE INVENTION

The invention relates to the field of recording apparatus used to form images on recording media. In particular, the invention relates to setting imaging parameters of recording apparatus employed to form images on recording media such as printing plates.

BACKGROUND OF THE INVENTION

Contact printing using high volume presses is commonly employed to print a large number of copies of an image. Contact printing presses employ various printing elements such as printing plates, printing sleeves, printing cylinders, and the like to apply colorants to a surface to form an image thereon. The surface can form part of a receiver medium (e.g. paper) or can form part of an intermediate component adapted to transfer the colorant from its surface to the receiver medium (e.g. a blanket cylinder of a press). In either case, a colorant pattern is transferred to the receiver medium to form an image on the receiver medium.

These printing elements are a form of recording media that typically undergo various processes to render them in a suitable configuration for use in a printing press. For example, exposure processes are used to form images on an imageable surface of a recording media that has been suitably treated so as to be sensitive to light or heat radiation. One type of exposure process employs film masks. The masks are typically formed by exposing highly sensitive film media using a laser printer known as an "image-setter." The imaged film mask is placed in area contact with a sensitized recording media, which is in turn exposed through the mask. Printing plates exposed in this manner are typically referred to as "conventional printing plates." Typical conventional lithographic printing plates are sensitive to radiation in the ultra-violet region of the light spectrum.

Another conventional method exposes media directly through the use of a specialized recording apparatus typically referred to as a plate-setter. A plate-setter in combination with a controller that receives and conditions image data for use by the plate-setter is commonly known as a "computer-to-plate" or "CTP" system. CTP systems offer a substantial advantage over image-setters in that they eliminate film masks and associated process variations associated therewith. Typically, a recording head within the CTP system is controlled in accordance with image data to selectively emit radiation beams to form image picture elements known as image pixels on a surface of a recording media. The radiation beams typically induce a physical or chemical change to an image modifiable surface of the recording media.

Various factors can adversely affect the quality of the images formed on recording media. This has led to a need for the establishment of various process controls for the required image forming actions. Typically, there are a number of imaging parameters that need to be optimally set to achieve a desired quality result. One important parameter is the level of radiation exposure provided on the recording media. Exposure is typically defined as the amount of radiant energy per unit area that impinges on the recording media during the imaging process. Depending on the recording media type, it may be necessary to control this parameter within a few percent or less.

This situation is further compounded in multi-beam recording apparatus in that each beam needs to impart a substantially equal exposure to the recording media so that various imaging errors or artifacts are not created. Unless it can be guaranteed that all beams in a multi-beam recording head have identical size and propagation characteristics, it may not be possible to perform a simple power or intensity balance because exposure has both a spatial component and a power or intensity component. While it may be possible to directly measure beam size, the measurement is quite complicated and accurate results are difficult to achieve. Systems exists which are well suited to beam analysis but they are usually in the form of stand alone equipment and are not necessarily suitable or cost effective for inclusion in a CTP system.

The pragmatic approach, which is commonly adopted, is to let the recoding media be the measurement tool. Since the human eye is sensitive to slight image variations, a trained operator can sometimes make a diagnosis of an imaged recording media and perform the required adjustments to the recording apparatus based on these observations. The use of densitometers, which are instruments that determine the optical density of an image element by measuring the intensity of radiation reflected or transmitted by the image element are sometimes also employed.

Conventional methods for picking a best or optimum setpoint for a particular imaging parameter typically involve plotting a series of image strips, each of the image strips being formed in accordance with a particular imaging parameter value. The optical density of each of the image strips is measured using a densitometer and the imaging parameter value corresponding to a particular optical density value is selected. Unfortunately, for many cases, the optical density varies only a little as the imaging parameter value is varied and the accuracy of the densitometer may be limited in detecting these subtle differences. These issues can make it very difficult to accurately set the particular imaging parameter to an optimum value.

Whether using a densitometer or simply judging a recording media by eye, the process remains manual and requires intervention of trained personnel. As the use of recording apparatus such as CTP systems gains in popularity, techniques that can be employed to conveniently adjust various imaging parameters for optimum performance become increasingly important.

There is a need to provide improved methods and apparatus for setting up imaging parameters important in the process control of an image forming operation undertaken on a recording media.

There is a further need to reduce operator intervention in an image parameter set-up process, particularly with respect to making judgments on the subjective quality of test patterns.

SUMMARY OF THE INVENTION

Briefly, according to one aspect of the present invention a method for adjusting an imaging parameter includes operating a recording head to form a first set of image features on a recording media, wherein each image feature in the first set of image features is formed while the imaging parameter is set to a first predetermined value; operating the recording head to form a second set of image features on the recording media, wherein each image feature in the second set of image features is formed while the imaging parameter is set to a second predetermined value different from the first predetermined value; interleaving image features of the first set of image features with image features of the second set of image features to form an interleaved pattern of image features on the recording media; generating data from the interleaved pattern of image features formed on the recording media; analyzing the data to determine a quantified value representative of banding in the interleaved pattern of image features; and adjusting the imaging parameter based at least on the quantified value.

The invention and its objects and advantages will become more apparent in the detailed description of the preferred embodiment presented below.

BRIEF DESCRIPTION OF THE DRAWINGS

Embodiments and applications of the invention are illustrated by the attached non-limiting drawings. The attached drawings are for purposes of illustrating the concepts of the invention and may not be to scale.

DETAILED DESCRIPTION OF THE INVENTION

Throughout the following description specific details are presented to provide a more thorough understanding to persons skilled in the art. However, well-known elements may not have been shown or described in detail to avoid unnecessarily obscuring the disclosure. Accordingly, the description and drawings are to be regarded in an illustrative, rather than a restrictive sense.

Figure 1:
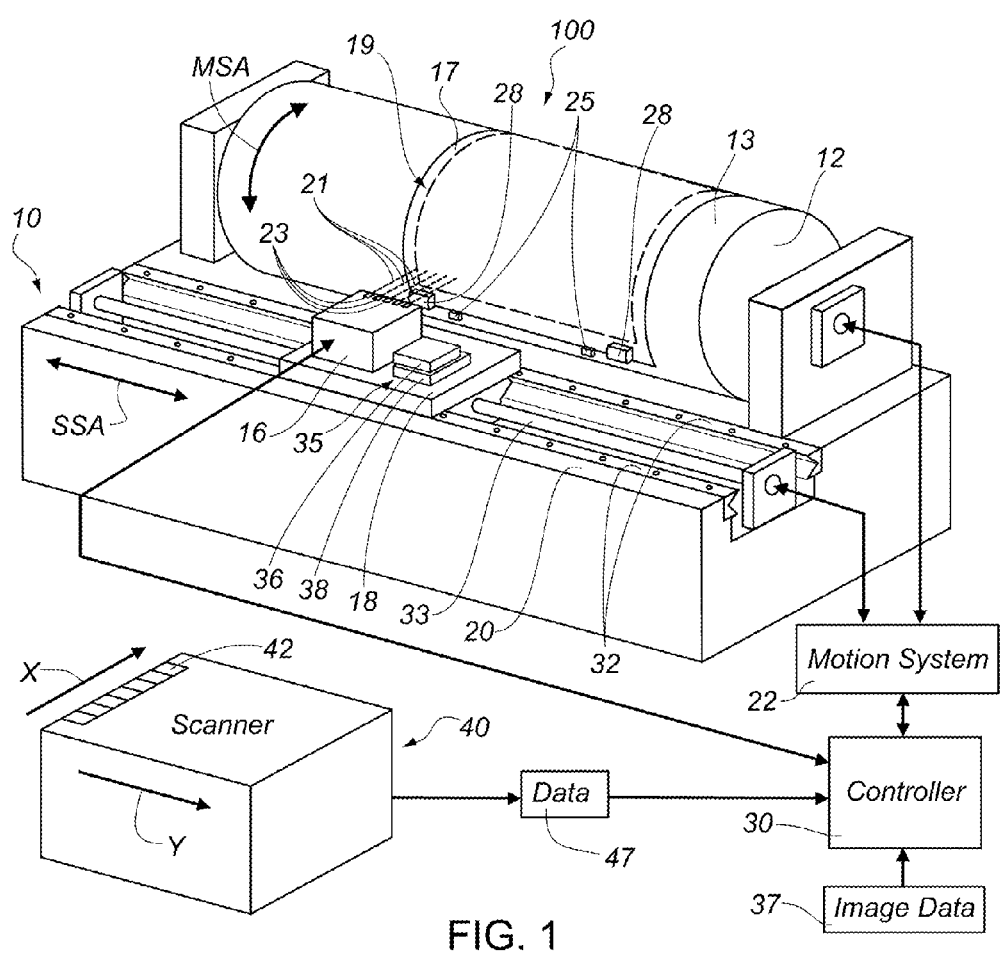
FIG. 1 is a schematic perspective view of an imaging and diagnostic system as per an example embodiment of the invention.

FIG. 1 schematically shows an imaging and diagnostic system 100 according to an example embodiment of the invention. Imaging and diagnostic system 100 includes a recording apparatus 10 for forming an image 19 (i.e. schematically represented by broken lines) on a recording media 17. Various images 19 can be formed by recording apparatus 10. In various example embodiments of the invention, various calibration images will be formed to determine a best setpoint for a particular imaging parameter. Without limiting the scope of the possible images that can be formed, image 19 will herein be referred to as calibration image 19 for the purpose of describing embodiments of the present invention. Recording media 17 can include various media comprising a surface suitable for forming calibration image 19 thereupon. Recording apparatus 10 includes a media support 12, which in this example embodiment is configured as per an external drum configuration. Other embodiments of the invention can include other forms of media supports configured according to internal drum configurations or flat-bed configurations for example.

In this example embodiment, recording media 17 is supported on a cylindrical surface 13 of media support 12. One or more edge portions of recording media 17 are secured to cylindrical surface 13 by clamps 28. Other example embodiments of the invention can secure recording media 17 to media support 12 by other methods. For example, a surface of recording media 17 can be secured to cylindrical surface 13 by various methods including providing a low-pressure source between the surfaces. Media support 12 is movably coupled to support 20. In this example embodiment, media support 12 is rotationally coupled to support 20. In this example embodiment, media support 12 includes a plurality of registration features 25. Registration features 25 are employed to orient recording media 17 with respect to media support 12.

Recording apparatus 10 includes recording head 16, which is movable relative to media support 12. In this example embodiment of the invention, media support 12 is adapted to move by rotating about its rotational axis. In this example embodiment, recording head 16 is mounted on movable carriage 18. Carriage 18 is operated to cause recording head 16 to be moved along a path aligned with the rotational axis of media support 12. Motion system 22 is employed to provide relative movement between recording head 16 and media support 12. Motion system 22 (which can include one or more motion systems) can include any suitable drives needed for the required movement. In this example embodiment of the invention, motion system 22 is used to move media support 12 along a path aligned with main-scan axis MSA and is used to move recording head 16 along a path aligned with sub-scan axis SSA. Guide system 32 is used to guide carriage 18 which is moved under the influence of transmission member 33. In this example embodiment of the invention, transmission member 33 includes a precision screw mechanism. In some example embodiments, a plurality of recording heads 16 is moved such that each of the recording heads 16 is moved independently of each other. In some example embodiments, a plurality recording heads 16 are moved in tandem.

Those skilled in the art will realize that various forms of relative movement between recording head 16 and media support 12 can be used in accordance with the present invention. For example, in some cases recording head 16 can be stationary while media support 12 is moved. In other cases, media support 12 is stationary and recording head 16 is moved. In still other cases, both the recording head 16 and the media support 12 are moved. One or both of recording head 16 and media support 12 can reciprocate along corresponding paths. Separate motion systems can also be used to operate different systems within recording apparatus 10.

In this example embodiment, recording head 16 includes a radiation source (not shown), such as a laser. The wavelength of radiation is selected to suit the type of recording media 17 that is being imaged and can include wavelengths in the infrared, visible and ultraviolet spectrums for example. In various example embodiments, recording apparatus 10 includes a plurality of individually addressable recording channels 23, each of the recording channels 23 being controllable to form various image portions on recording media 17. The plurality of recording channels 23 can be arranged in different configurations including one dimensional or two dimensional array configurations.

In this example embodiment, recording head 16 is controllable to emit various radiation beams 21 while scanning over recording media 17 to form calibration image 19. Radiation beams can be image-wise modulated according to image data 37 specifying the image to be written. In this example embodiment, one or more of the recording channels 23 are driven appropriately to produce radiation beams 21 with active intensity levels wherever it is desired to form an imaged portion of calibration image 19. Recording channels 23 not corresponding to the imaged portions are driven so as not to image corresponding regions. Each of the recording channels 23 is controllable to form a unit element of image typically referred to as an image pixel or an image dot on recording media 17 in accordance with information provided by image data 37. Various image pixels can be combined with other image pixels to form various features of calibration image 19. In various example embodiments of the invention, image pixels can be arranged in various image pixel patterns including halftone patterns, stochastic patterns and hybrid patterns for example.

Calibration image 19 can be formed on recording media 17 by different methods. For example, recording media 17 can include a modifiable surface, wherein a property or characteristic of the modifiable surface is changed when irradiated by a radiation beam 21. A radiation beam 21 can be used to ablate a surface of recording media 17 to form a calibration image 19. A radiation beam 21 can be used to facilitate a transfer of an image forming material to a surface of recording media 17 to form calibration image 19 (e.g. a thermal transfer process). A radiation beam 21 can undergo a direct path from a radiation source to the recording media 17 or can be deflected by one or more optical elements towards the recording media 17.

In many cases, the number of recording channels 23 is insufficient to completely form calibration image 19 during a single marking operation. Accordingly, calibration image 19 can be formed by merging multiple sub-images together, each of the sub images being formed during a corresponding marking operation. The sub-images can be formed in different manners. For example, calibration image 19 can be formed from plurality of markings referred to as "shots." During each shot, recording head 16 is positioned relative to a region of recording media 17. Once positioned, recording channels 23 are activated to form an arrangement of image pixels on the region of recording media 17. Once the arrangement of image pixels is formed, relative movement between recording channels 23 and recording media 17 is effected to position the recording channels 23 in the vicinity of an adjacent region and another shot is taken to form a next image pixel arrangement.

The various sub-images can also be formed by scanning. In some example embodiments of the invention, scanning can be performed by deflecting radiation beams emitted by recording channels 23 relative to recording media 17. In some example embodiments, scanning can include establishing relative movement between the recording channels 23 and recording media 17 as the recording channels 23 are activated to form corresponding image pixels. In these example embodiments, a column of image pixels is formed along a scan direction by a given recording channel 23 as relative movement between the given recording channel 23 and the recording media 17 is established. Relative movement can include moving one or both of the recording channels 23 and recording media 17. Each of the scanned image pixel columns are combined to form a sub-image typically referred to as an image swath.

Different scanning techniques can be employed to form image swaths. For example, "circular" scanning techniques can be used to form "ring-like" or "circular" image swaths. A circular image swath can be formed when controller 30 causes recording head 16 to emit radiation beams 21 while maintaining recording head 16 at a first position along sub-scan axis SSA and while moving media support 12 along a direction of main-scan axis MSA. In this regard, scanning occurs solely along a main-scan direction. After the completion of a first circular image swath, recording head 16 is moved to a second position along sub-scan axis SSA. A second circular image swath is then formed as recording head 16 is operated to emit radiation beams 21 while maintaining recording head 16 at second position and while moving media support 12 along a direction of main-scan axis MSA.

Helical scanning techniques can be employed to form helical image swaths which are formed in a spiral or helical fashion over a surface of recording media 17. For example, helical image swaths can be formed when controller 30 causes recording head 16 to emit radiation beams while simultaneously causing recording head 16 to move along a direction of sub-scan axis SSA and media support 12 to move along a direction of main-scan axis MSA. In this regard, scanning occurs along both a main-scan direction and along a sub-scan direction and each helical image swath comprises an orientation that is skewed relative to main-scan axis MSA.

It is to be noted that other forms of skewed scanning techniques similar to helical scanning techniques can be used in various embodiments of the present invention. Skewed scanning techniques need not be limited to external drum configurations but can also be employed with other configurations of recording apparatus. For example, in some internal drum recording apparatus, media is positioned on a concave surface of a media support while a radiation beam is directed towards an optical deflector positioned along a central axis of the media support. The optical deflector is rotated while moving along central axis to cause the radiation beam to follow a spiral path on the surface of the recording media. Flat-bed recording devices can include coordinated movement between the recording channels and the recording media to form various image swaths with a particularly desired orientation.

In some cases, the radiation beam 21 emitted by recording channels 23 have a limited depth of focus and thus require focus adjustment periodically or in real time. In such systems, any significant drift will take radiation beams 21 out of focus and adversely affect a desired quality of an image. The effect can be quite pronounced and it is not uncommon for a drift of in the order of several microns to significantly degrade imaging performance. Recording apparatus 10 can be equipped with a focus adjustment mechanism which can effect a simple focus adjustment between plots in some example embodiments of the invention. In other example embodiments, the focus adjustment mechanism can include a servo focus controller which continuously adjusts to keep focus in a desired range. An example of a focus adjustment mechanism is contained in commonly assigned U.S. Pat. No. 6,137,580 (Gelbart), which is herein incorporated by reference in its entirety. In this example embodiment, an auto-focus system 35 is employed. Auto-focus system 35 includes a secondary laser source 36 to generate an incident beam (not shown) on a surface and a position sensitive detector 38 to receive the reflected beam and detect the position of the surface. The secondary laser source 36 can be at a wavelength different from that of the primary laser source used in the generation of radiation beams 21. This has the advantage of separating the auto-focus signals from the writing signals to avoid crosstalk. Position sensitive detector 38 can include a photo-detector, a CCD detector or any other detector that is suitable for detecting a position of a reflected beam.

Imaging and diagnostic system 100 further includes a scanning image sensor which in this example embodiment includes scanner 40. Scanning image sensors which typically employ various image capture sensors are used to scan an image and generate data representing a portion of the image that was scanned. Present day scanners typically employ a charge coupled device (CCD) or a contact image sensor (CIS) as the image capture sensor. A typical CCD type scanner has at least one row of photo-elements for detecting the light intensity of a predetermined number of samples of an image that is to be scanned. The scanning resolution of a scanner is typically measured in dots per inch (DPI) which can vary from scanner to scanner. In many flatbed scanners, the resolution is determined by the number of sensors in a row of the sensors (i.e. typically referred to as the X direction scanning rate) and by the sampling rate of the array along a scanning direction of the scanner (i.e. typically referred to as the Y direction scanning rate). For example, if the resolution is 300 DPI×300 DPI for a scanner that is capable of scanning a letter-sized entity, then the scanner would typically employ at least one row made up of 2550 sensors (i.e. 300 DPI*8.5 inches) and would employ a drive suitable for conveying the sensor array in increments of $\frac{1}{300}^{th}$ of an inch (i.e. the sampling spatial period) to produce the sampling spatial frequency of 300 cycles per inch. In this example embodiment, scanner 40 includes a sensor array 42 arranged along the X direction. Sensor array 42 is adapted to generate data 47 during a scanning operation along the Y direction. In various example embodiments, data 47 is grayscale data. A limited number of sensor elements are schematically shown in sensor array 42 for clarity and their illustrated number is not indicative of a scanning resolution of scanner 40.

In some example embodiments of the invention, scanner 40 is a stand-alone device while in other embodiments scanner 40 is incorporated into some other sub-system in imaging and diagnostic system 100 such as recording apparatus 10 by way of non-limiting example. In some example embodiments of the invention, scanner 40 is a flatbed scanner which can form the basis of an economic diagnostic tool. Although other image acquisition and measurement devices can be employed, scanners are typically preferred in some example embodiments because of their precise registration, consistent geometric scale, illumination uniformity and massive parallel data acquisition capabilities. In example embodiments where a scanned image comprises color attributes, scanner 40 can include multiple sensor arrays 42, with a particular color filter associated with each of the sensor arrays 42. In typical applications, red, green and blue color filters are employed.

Imaging and diagnostic system 100 includes controller 30, which can include one or more individual controllers. Controller 30 can be used to control one or more systems of recording apparatus 10 including, but not limited to various motion systems 22 used by media support 12 and carriage 18. Controller 30 can also control media handling mechanisms that can initiate the loading or unloading of recording media 17 to, or from, media support 12 respectively. Controller 30 can also provide image data 37 to recording channels 23 and control recording channels 23 to form image pixels in accordance with this data. As shown in FIG. 1, scanned data 47 generated by scanner 40 is provided to controller 30. Controller 30 is operable for analyzing scanner data 47 in accordance with various example embodiments of the invention. Various systems can be controlled using various control signals or implementing various methods. Controller 30 is programmable and can be configured to execute suitable software and can include one or more data processors, together with suitable hardware, including by way of non-limiting example: accessible memory, logic circuitry, drivers, amplifiers, A/D and D/A converters, input/output ports and the like. Controller 30 can comprise, without limitation, a microprocessor, a computer-on-a-chip, the CPU of a computer or any other suitable microcontroller. Controller 30 can consist of several different logical units, each of which is dedicated to performing a particular task.

Figure 2:
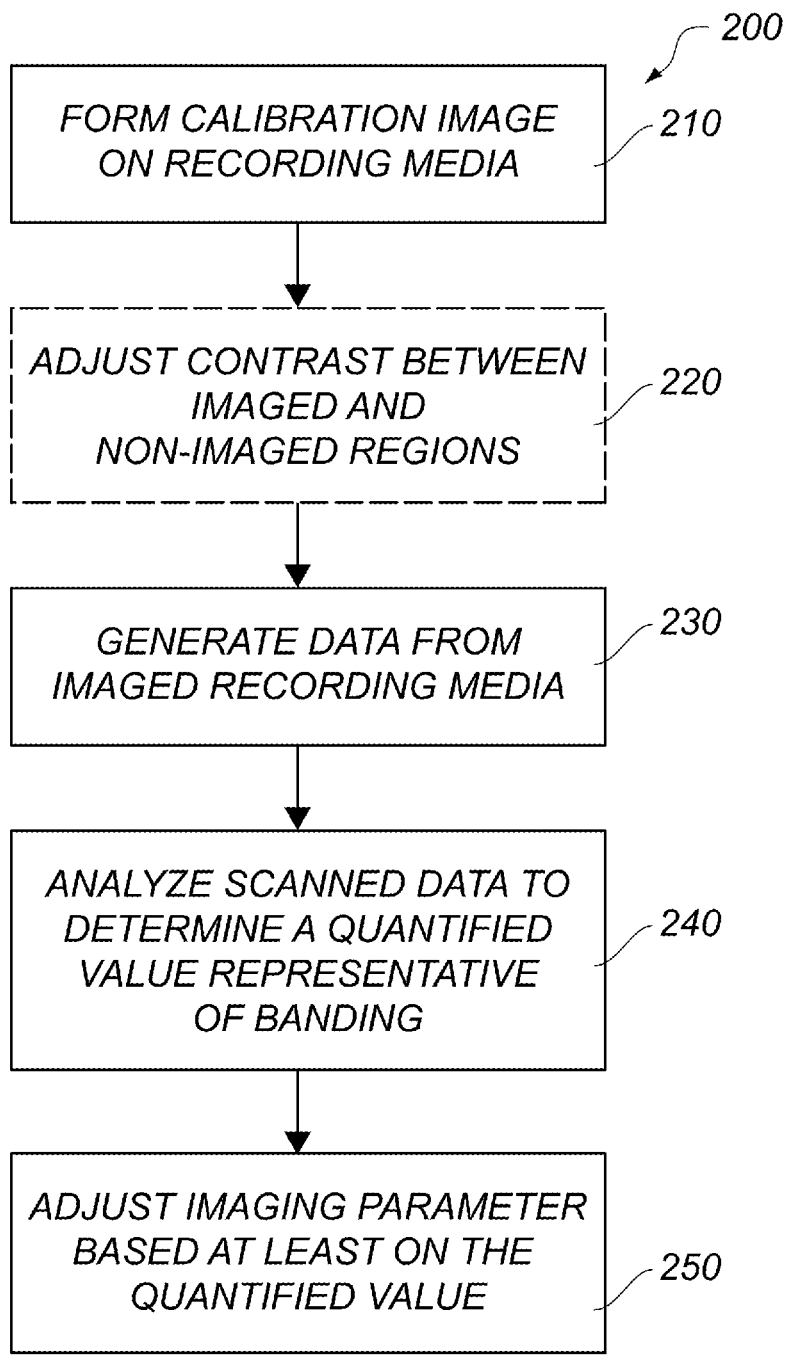
FIG. 2 is a flow chart representing a method as per an example embodiment of the invention.

FIG. 2 depicts a flow diagram representing a method 200 according to an example embodiment of the invention. Although method 200 is referenced to a use of imaging and diagnostic system 100, it is to be understood that is for illustration purposes only and does note preclude the use of other suitable systems. Recording media 17 is appropriately mounted on media support 12 and calibration image 19 is formed on recording media 17 in step 210. Calibration image 19 can comprise a number of imaged regions that are related to a particular imaging parameter that is to be optimally set. An imaged region can include an image feature pattern suitable for the set-up of a particular imaging parameter. In some example embodiments, calibration image 19 can include a plurality of imaged regions, wherein at least one of the imaged regions corresponds to a different imaging parameter than another of the image regions. In some example embodiments, calibration image 19 can include a plurality of imaged regions, wherein each of the imaged regions is formed in response to a change in a particular parameter of an imaging process. In some example embodiments, each of the image imaged regions is formed in response to a change in a selected parameter of an imaging process while one or more other imaging parameters of the imaging process remain constant. By way of non-limiting example, the an imaging parameter can be selected to be any one of: a power of a radiation source of associated with recording head 16, an intensity of recording channels 23, a speed of media support 12, a parameter related to the focusing of radiation beams 21 or any one of a number of the parameters which have and effect on an image formed by recording apparatus 10.

Figure 3A:
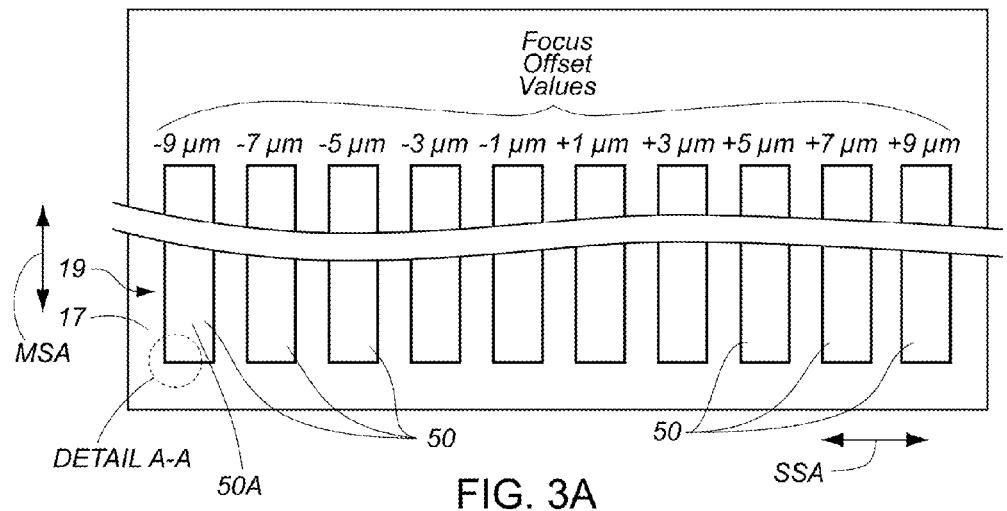
FIG. 3A shows a calibration image that includes a plurality of image feature patterns formed on recording media as per an example embodiment of the invention.

FIG. 3A shows a calibration image 19 comprising a plurality of image feature patterns 50 formed on recording media 17 as per an example embodiment of the invention. For clarity, recording media 17 is shown in an unwrapped or "flat" orientation. In this example embodiment, each of the image feature patterns 50 is formed by scanning radiation beams 21 over recording media 17. Main-scan axis MSA and sub-scan axis SSA are additionally shown to establish a reference frame for the image forming scans. In this example embodiment, recording media 17 and its associated calibration image 19 are appropriately sized in accordance with the size limitations of scanner 40. The number of image feature patterns 50 formed is determined based on various factors. In particular, the total number of image feature patterns 50 is selected in accordance with a subsequent analysis (i.e. to be described later) of the patterns to determine an optimum imaging parameter value. The present inventors have determined that usually at least ten image feature patterns 50 are required to effectively see a performance trend associated with changes in the selected imaging parameter. The present inventors have also determined that good results can be achieved if each of the image feature patterns 50 comprises a main-scan size that comprises the majority of the main-scan size of recording media 17. Imaging over most of recording media 17 allows errors in a subsequent analysis of the image patterns to be reduced.

Each of the image feature patterns 50 can include various image pixel patterns. In particular, the present inventors have determined that a two-by-two checkerboard image pixel pattern is very sensitive to imaging variations which in turn can cause variations to show up dramatically on recording media 17. In other example embodiments of the invention, each of the image feature patterns 50 can include various patterns of lines, features, solids or other entities. In various example embodiments, each image feature pattern 50 can include a specific pattern of image pixels selected in accordance with the particular imaging parameter that is being investigated. In this illustrated embodiment, each of the image feature patterns 50 is arranged in a linear array. In other example embodiments, the plurality of image feature patterns 50 can be arranged in other arrangements including for example, various two dimensional regular and non-regular arrangements.

Each of the various image feature patterns 50 is formed in accordance with a different predetermined value of a particular imaging parameter that is being investigated. In this example embodiment, each of the image feature patterns 50 corresponds to a change in a focusing imaging parameter. In many cases, the imaging performance of a recording apparatus 10 is strongly related to focus and it is often best to first ensure that the apparatus is optimally focused prior to calibrating other imaging parameters. In this particular example embodiment, each of the image feature patterns 50 is formed while a radiation source within recording head 16 is maintained at common radiation level suitable for the imaging of recording media 17 and a focus parameter is varied for each of the image feature patterns 50 by a predetermined amount. In this example embodiment, different focus values are provided by auto-focus system 35.

In this example embodiment, each of the each of the image features patterns 50 corresponds to a one of an overall focus offset value selected from within a range of −9 µm to +9 µm from a selected zero focus value. The zero focus value can be selected in various ways. For example, the zero value can arbitrarily selected within a given focal range of recording head 16 or a previously identified value can be selected. In this example embodiment, each of the overall focus values varies in step sizes of 2 µm, which the present inventors have found to provide sufficient granularity in the determination of a best focus. It is understood that these values are exemplary in nature and other suitable values can be readily employed by other example embodiments of the invention.

In this example embodiment, each of the image feature patterns 50 is made up of a plurality of sets of image features, wherein each of the image features in each of the sets is formed in accordance with a different predetermined focus value. In this example embodiment, each of the different predetermined focus values is selected such that an average of the focus values is equal to particular focus offset value selected for the corresponding image feature pattern 50 that the sets of image features form part of. For example, as shown in the detailed view A-A in FIG. 3B, the image feature pattern 50 corresponding to the overall focus offset value of −9 µm (i.e. image feature pattern 50A) is formed from a first set of image features 60A formed in accordance with a first focus value of −15 µm (i.e. represented by Focus Value #1) and a second set of image features 60B formed in accordance with a second focus value of −3 µm (i.e. represented by Focus Value #2). In the this example embodiment each of the first and second focus values are different from one another, and in particular, are selected such that an average of the two is equal to a third predetermined value which is the targeted focus offset value of −9 µm in this case. It is to be noted that the other image feature patterns 50 are also formed in a similar fashion. For example, the image feature pattern 50 corresponding to the +7 µm overall focus offset value would be formed from a first set of image features formed in accordance with a first focus value of +1 µm and second set of image features formed in accordance with a second focus value of +13 µm (i.e. the average of the first and second values equaling +7 µm). In this example embodiment, a 12 µm spread separates each of the first and second focus values corresponding to each of the image feature patterns 50. Although the present inventors have found that 12 µm spread works well for imaging resolutions on the order of 2400 DPI, other suitable values can be employed in other example embodiments of the invention. For example, the present inventors have found that a spread of 48 µm between the first and second focus values works particularly well for an imaging resolution of 1200 DPI. In this example embodiment, the image features in each of the first and second sets of image features in each of the image feature patterns 50 are made up of a two-by-two checkerboard image pixel pattern.

Many conventional methods of determining a set point for a particular imaging parameter have tried to directly quantify or qualify an optical density of each of plurality of test images in which each of the test images is formed in accordance with a particular value of the imaging parameter. In many cases however only subtle differences in the optical density among the test images exists and thereby limits the effectiveness these conventional direct measurement techniques.

The present invention alleviates the limitations associated with directly measuring an optical density corresponding to a given imaging parameter target value. In various example embodiments of the invention, each image feature pattern 50 includes a plurality of different images features wherein each of the image features are formed in accordance with a member of a set of different imaging parameter values that bounds a targeted value of the imaging parameter. Rather than directly measuring an optical density corresponding to the targeted value of the imaging parameter, a difference in the optical densities of each of the plurality of image features corresponding to a given image feature pattern 50 is determined to provide a relative measurement. If the targeted value corresponds to an optimum set-point for the imaging parameter, and each of the bounding parameter values are equally spaced from the optimum set-point, then there will be little difference between the measured optical densities corresponding to each of the bounding parameter values. If the targeted value becomes biased from the optimum set-point, then differences between the measured optical densities corresponding to the bounding parameter values will increase. These density differences will create an imaging artifact known as "banding."

Banding is common image artifact that usually manifests itself as density variations at the merge point between adjacent sub-images (e.g. adjacent image swaths). In many cases, these banding artifacts repeat with a period related to the spatial period of the sub-images. The present invention purposely induces a banding type artifact within each of the image feature patterns 50 to determine an optimal set-point of the given imaging parameter that is being analyzed. In this example embodiment, each image feature pattern 50 is formed in accordance with a different set of the first and second predetermined parameter values. Each of the first and second sets of predetermined parameter values are selected to cause an optical density difference between the first and second sets of image features in each of the image feature patterns 50 to be different than an optical density difference between the first and second sets of image features in another of the image feature patterns 50. Accordingly, different levels of banding will be associated with different ones of the image feature patterns 50.

Figure 3B:
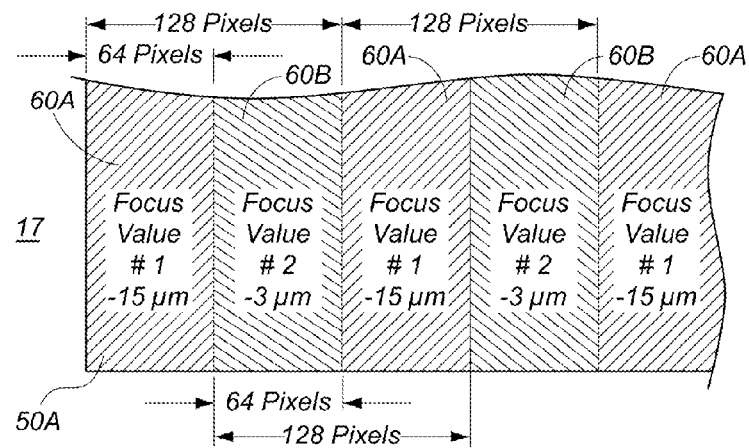
FIG. 3B shows a detail A-A of a portion of one of the image feature patterns shown in FIG. 3A.

As shown if FIG. 3B, the first set of image features 60A and the second set of image features 60B are formed on the recording media such that the image features are interleaved with one another. In this regard, the image feature pattern 50 corresponding to these interleaved image features is referred to as an interleaved pattern of image features. Since each of the first set of image features 60A and the second set of image features 60B is formed in accordance with a different focus value, a banding pattern is created by optical density differences among the interleaved image features. In this example embodiment, each of the image features of the first set of image features 60A are contiguously arranged with various image features in the second set of image features 60B. In various example embodiments, the first set of image features 60A is formed separately from the second set of image features 60B. For example, two image features of the first set of image features 60A can be formed during a first imaging of the recording media 17 (e.g. during a first scan) and a image feature of the second set of image features 60B can be formed between the two image features during a second imaging of recording media 17 (e.g. during a second scan). In other example embodiments of the invention, an image feature in the first set of image features 60A can be formed at the same time as an image feature in the second set of image features 60B. The manner in which image features in each of the first and second sets of image features 60A and 60B is formed may be motivated by the way an imaging parameter value (i.e. a focus value in this case) can be altered in accordance with the particular image feature that is to be formed.

In various example embodiments of the invention, the level of banding in each of the image feature patterns 50 is analyzed in the frequency domain. An analysis of various test patterns in the frequency domain is described in commonly assigned U.S. Patent Publication No. 2009/0066796 (Karasyuk et al.) which is hereby incorporated by reference in its entirety. One particular problem associated with analyzing an element corresponding to a specific frequency in the frequency domain is that the results are sensitive to noise in the data that is being analyzed.

In this example embodiment, the first set of image features 60A and the second set of image features 60B are each formed as a regular pattern of image features on recording media 17. In the illustrated embodiment, each image features in the first set of image features 60A and each of the image features in the second set of image features repeat along a sub-scan direction with a spatial frequency of 1 cycle per 128 image pixels which can also be expressed as 18.75 cycles per inch for a 2400 DPI image pixel resolution. In this example embodiment, the spatial frequency of the image features in each of the first and second sets of image features 60A and 60B is selected to reduce extraneous cyclic noise factors which can complicate a future analysis in the frequency domain. One potential source of noise is the image swaths that the image features are formed in. As previously stated, a regular banding pattern can arise at the merge points between adjacent image swaths. If each of the first and second sets of image features 60A and 60B has a sub-scan spatial frequency that is a harmonic of the sub-scan spatial frequency of the image swaths, harmonic interference can arise during a subsequent analysis in the frequency domain. In this example embodiment, recording head 16 is operated to form a plurality of image swaths, each having a sub-scan size equal to 224 image pixels and accordingly any banding associated with the image swaths will correspond to a spatial frequency of 1 cycle per 224 image pixels or 10.71 cycles per inch for a 2400 image pixel resolution. In this example embodiment, the sub-scan spatial frequency of each of the first and second sets of image features 60A and 60B was selected to equal a non-integer multiple of the sub-scan spatial frequency of the image swaths. In this example embodiment, the sub-scan spatial frequency of each of the first and second sets of image features 60A and 60B was selected to not be a harmonic of the sub-scan spatial frequency of the image swaths. In other example embodiments of the invention, the sub-scan spatial frequency of the image swaths can be selected to equal a non-integer multiple of the sub-scan spatial frequency of each of the first and second sets of image features 60A and 60B. In other example embodiments, the sub-scan spatial frequency of the image swaths can be selected to not be a harmonic of the sub-scan spatial frequency of each of the first and second sets of image features 60A and 60B. The choice in which the sub-scan spatial frequency of each of the first and second sets of image features 60A and 60B is selected to equal an non-integer multiple or a non-integer factor of the sub-scan spatial frequency of the image swaths can be motivated by various factors such as a sub-scan size of each of the image swaths for example.

In this example embodiment, each image feature in each of the first and second sets of image features 60A and 60B comprises a sub-scan size equal to 64 pixels which corresponds to a contiguous arrangement of the image features. In this example embodiment, each of the other image feature patterns 50 shown in FIG. 3A is also an interleaved image feature pattern with similar spatial characteristics.

In step 220, a contrast between imaged and non-imaged regions of the recording media 17 is adjusted. For example, various chemical processing steps can be employed to remove undesired regions of the image modifiable surface of the recording media 17 to adjust the contrast. Contrast can be adjusted by separating a donor element from a receiver element in a thermal transfer process. Adjusting contrast between the imaged and non-image regions of recording media 17 can be used to enhance an optical density difference between the first set of image features 60A and the second set of image features 60B. It is to be noted that block 220 is outlined in broken lines to identify it as optional since the adjustment of contrast need not be required in all recording media. For example, some recording media 17 work in an ablative fashion where the unwanted regions are removed by the imaging process. In this case, the imaging and contrast enhancement are achieved simultaneously although it is usually necessary to provide a debris collection system to draw the ablated materials away from the recording media 17.

Figure 4:
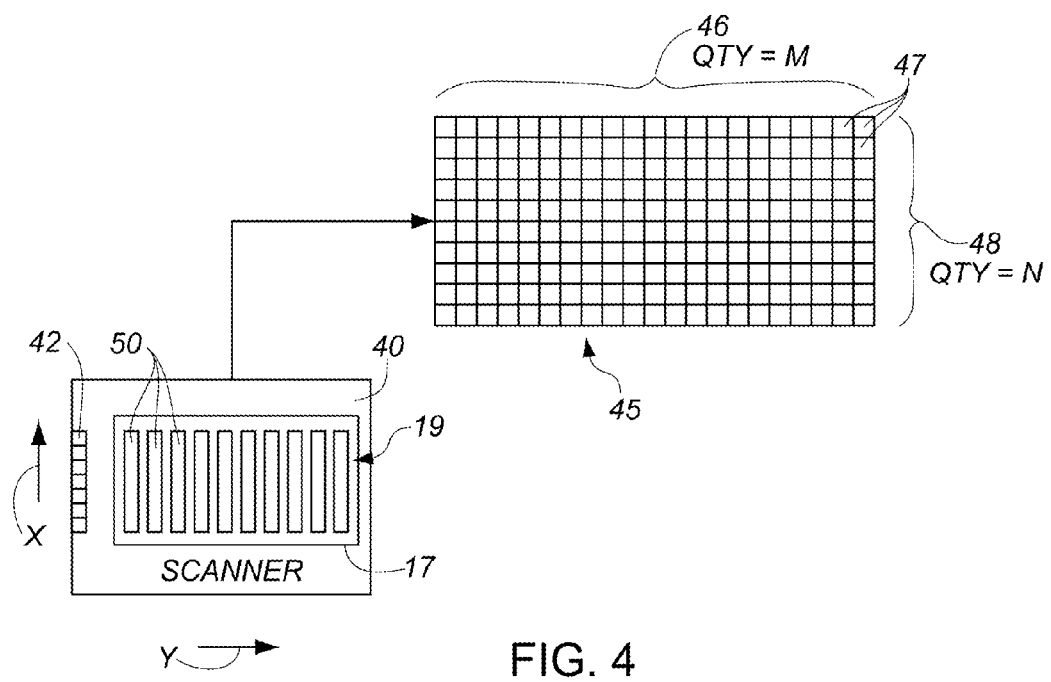
FIG. 4 schematically shows a data arrangement generated by a scanner employed to scan over a recording media imaged as per an example embodiment of the invention.

In step 230, data is generated from the imaged recording media 17. In this example embodiment of the invention, scanner 40 is employed to generate data 47. As schematically represented in FIG. 4, scanner 40 is employed to scan over the imaged recording media 17 generally along a scanning direction (i.e. the Y direction). In this example embodiment, the imaged recording media 17 is oriented within scanner 40 such that a sub-scan direction employed during the formation of calibration image 19 is aligned with the Y direction. In this particular example embodiment, each of the image feature patterns 50 comprises elongate image features that extend along a first direction and scanner 40 is operated to scan across the imaged recording media 17 along a second direction (i.e. the Y direction) that intersects the first direction in a substantially orthogonal manner. Scanner 40 can include, or be modified to include, various guide mechanisms to facilitate the scanning of imaged recording media 17 along a desired direction. In this example embodiment, scanner 40 generates a two dimensional (2D) matrix 45 of data 47. In particular, the data 47 is regularly arranged in a plurality of data columns 46 numbering M and a plurality of data rows 48 numbering N. In this example embodiment, each of the data rows 48 correspond to the scanning direction (i.e. the Y direction) while each of the data columns 46 correspond to arrangement directions of sensor array 42 in scanner 40 (i.e. the X direction). It is understood that the number of cells representing data 47 in matrix 45 shown in FIG. 4 is limited for clarity. The number of cells that would form matrix 45 would be related to the scanning resolutions of scanner 40 along the X and Y directions.

The sampling rate of scanner 40 along the scanning direction (i.e. the Y direction scanning rate) has a significant effect of a subsequent analysis of the data 47 in the frequency domain. In one example embodiment, it is desired that the spatial frequency of each of the first and second sets of image features 60A and 60B be wholly represented by an integer factor of the scanner sampling spatial frequency. In this example embodiment, the sub-scan spatial frequency of the image features in each of the first and second sets of image features 60A and 60B is selected to equal a non-integer multiple of a sub-scan spatial frequency of the image swaths. Additionally, the sub-scan spatial frequency of the image features in each of the first and second sets of image features 60A and 60B is selected such that the sampling spatial frequency employed by scanner 40 during the scanning is equal to an integer multiple of the sub-scan spatial frequency of the image features in each of the first and second sets of image features 60A and 60B. In this specific example embodiment, the sub-scan spatial frequency of the image features in each of the first and second sets of image features 60A and 60B is 1 cycle per 128 pixels or 18.75 cycles per inch for a 2400 DPI image pixel resolution. The scanning resolution of scanner 40 along the Y scanning direction is 300 DPI which provides a sampling spatial frequency along the scanning direction of 300 cycles per inch. Accordingly, the sampling spatial frequency along the scanning direction of scanner 40 is 16 times the sub-scan spatial frequency of the image features in each of the first and second sets of image features 60A and 60B. This means that every 16 samples of scanner 40 will correspond to 1 complete cycle of the image features in each of the corresponding first and second sets of image features 60A and 60B.

Data 47 in the frequency domain is finite and is therefore separated into frequency bins. If a particular targeted frequency fits perfectly into a bin it will yield a maximum amplitude. If the targeted frequency is not so aligned, deviations in the strength of the amplitude will arise. Additionally, noise is created in the frequency spectrum when a periodic signal is cut part way through. Accordingly, it is preferred that the frequency that is being analyzed fit into the data in each data row 48 an integer number of times. In some example embodiments of the invention, scanner 40 is operated such that each sensor element of scanner 40 takes a first integer number of samples while scanning across the overall width of an image feature pattern 50. One, or both of the scanning resolution and the spatial frequency of the image features in each of the first and second sets of image features 60A and 60B is varied to cause a product of the first integer number and the sampling spatial period of scanner 40 to equal a product of a second integer number and the sub-scan spatial period (i.e. the inverse of the sub-scan spatial frequency) of the of the first and second sets of image features 60A and 60B. For example, in a previously described embodiment, the sub-scan spatial frequency of the image features in each of the first and second sets of image features 60A and 60B was 1 cycle per 128 pixels or 18.75 cycles per inch. Accordingly, each of the first and second sets of image features 60A and 60B has a sub-scan spatial period of 0.0533 inches. If the scanning resolution of scanner 40 along the Y scanning direction was changed from 300 DPI to 200 DPI, the scanner sampling spatial frequency would no longer be equal to an integer multiple of the sub-scan spatial frequency of the image features in each of the first and second sets of image features 60A and 60B. Nonetheless, a suitable subsequent analysis of data 47 in the frequency domain can be accomplished since every 3 of the sub-scan spatial periods (i.e. 0.0533 inches) of the image features in each of the first and second sets of image features 60A and 60B is equal to 32 of the sampling spatial periods (i.e. 0.005 inches) employed by scanner 40. In these example embodiments, a first integer multiple of the sampling spatial frequency employed by scanner 40 during the scanning is equal to a second integer multiple of the sub-scan spatial frequency of the image features in each of the first and second sets of image features 60A and 60B. In this context, the "integer multiple of a value" can include integer multiples of the value that are equal to value or greater.

Some, or all, of the sub-scan spatial frequency of the image features, the sub-scan spatial frequency of the image swaths and the sampling spatial frequency of the employed scanner 40 can be varied in various in embodiments of the present invention. In some particular example embodiments, these varied entities can be controlled to cause the sub-scan spatial frequency of the image features in each of the first and second sets of image features 60A and 60B to be equal to a non-integer factor or a non-integer multiple of the sub-scan spatial frequency of the image swaths while a first integer multiple of the sampling spatial frequency employed by scanner 40 during the scanning is equal to a second integer multiple of the sub-scan spatial frequency of the image features in each of the first and second sets of image features 60A and 60B.

In step 240 the scanned data 47 is analyzed. In this example embodiment, the arrangements of data 47 representative of each of the image feature patterns 50 are analyzed in the frequency domain. In this example embodiment, a Fast Fourier Transform (FFT) algorithm is employed to analyze data 47. Other example embodiments of the invention can employ other suitable algorithms to analyze data 47 in the frequency domain. In this example embodiment, the analysis can be performed by controller 30 or the like.

Figure 5:
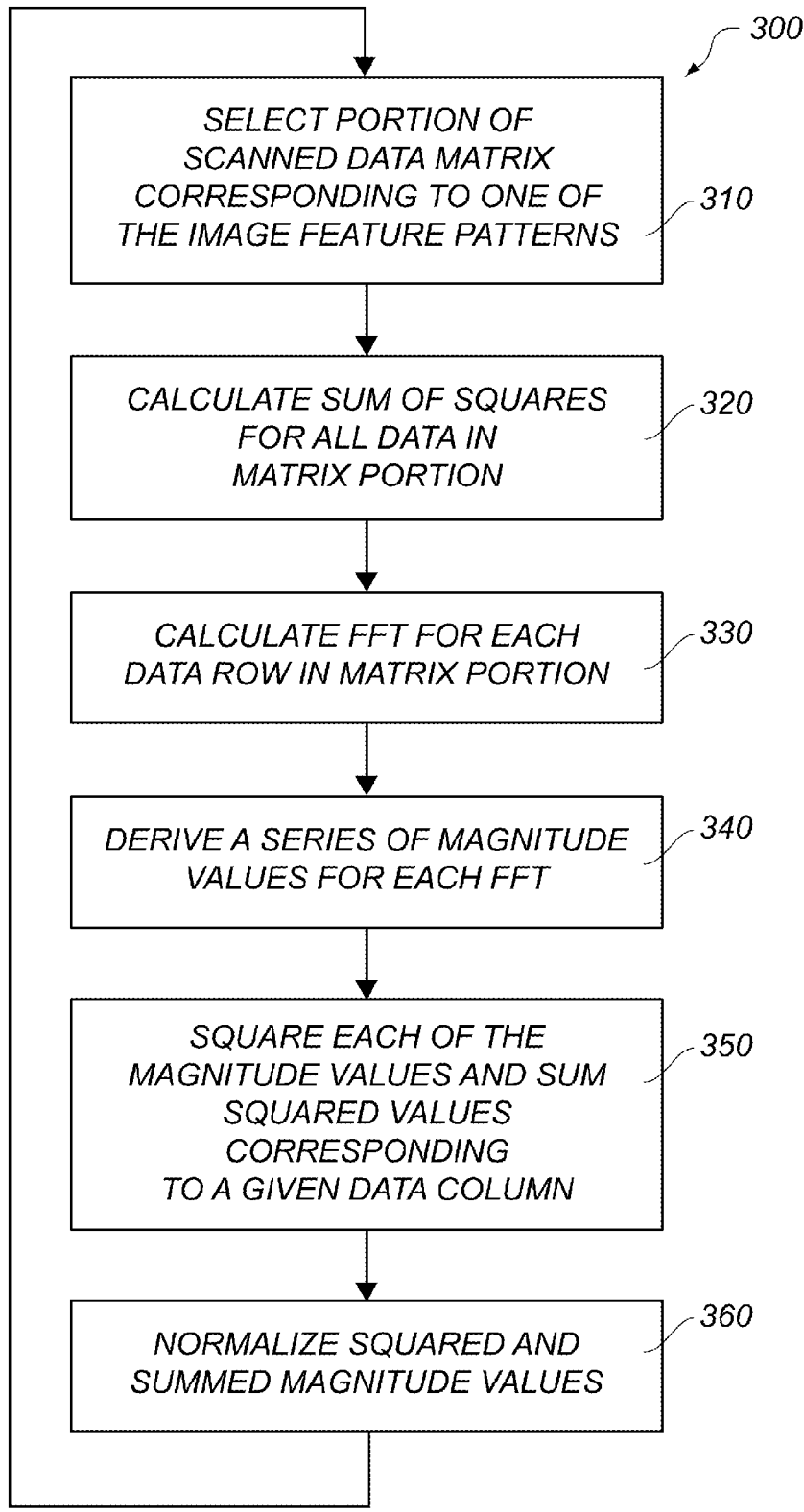
FIG. 5 is a block diagram representing a Fast Fourier Transform (FFT) algorithm employed in an example embodiment of the invention.

FIG. 5 shows a block diagram representing an FFT algorithm 300 employed in an example embodiment of the invention. In step 310, a data arrangement comprising data 47 in a portion of matrix 45 corresponding to a selected one the image feature patterns 50 is selected.

In step 320 a sum of squares is calculated for all the data 47 in the data rows 48 and data columns 46 of portion of matrix 45 to determine a value representing an overall density value for the selected one of the image feature pattern 50.

A FFT is calculated in step 330 for each of the data rows 48 in the portion of matrix 45. In this example embodiment, each FFT will contain M complex numbers, wherein each complex number represents a complex Fourier transform amplitude within the spatial spectrum associated with the corresponding data row 48. In this example embodiment, an equal number of complex numbers will be associated with each data row 48 and corresponding complex numbers will be related to data 47 located in a given data column 46.

In step 340 a magnitude value derived from each of the real and imaginary components of each of the complex numbers is squared. Step 340 is performed for each of the FFT calculated for each data row 48.

In step 350 all the squared magnitude values derived from each data row 48 and corresponding to a given data column 46 are summed to provide a single row of squared and summed magnitude values.

In step 360, squared and summed magnitude values determined in step 350 are normalized with the value calculated in step 320 to provide a final row of values that represents the frequency domain for the portion of the matrix 45 corresponding to the selected image feature pattern 50.

The FFT algorithm 300 is repeated for each portion of matrix 45 corresponding to a given one of the image feature patterns 50. Each portion of the matrix 45 is thus analyzed in the frequency domain to provide a quantified value representative of banding created by differences in optical density among the interleaved image features in a corresponding image feature pattern 50 that is formed in accordance with a particular imaging parameter value (i.e. a focus value in this case). In this regard, each quantified value is a member of a group of quantified values determined from the plurality of image feature patterns 50.

Figure 6:
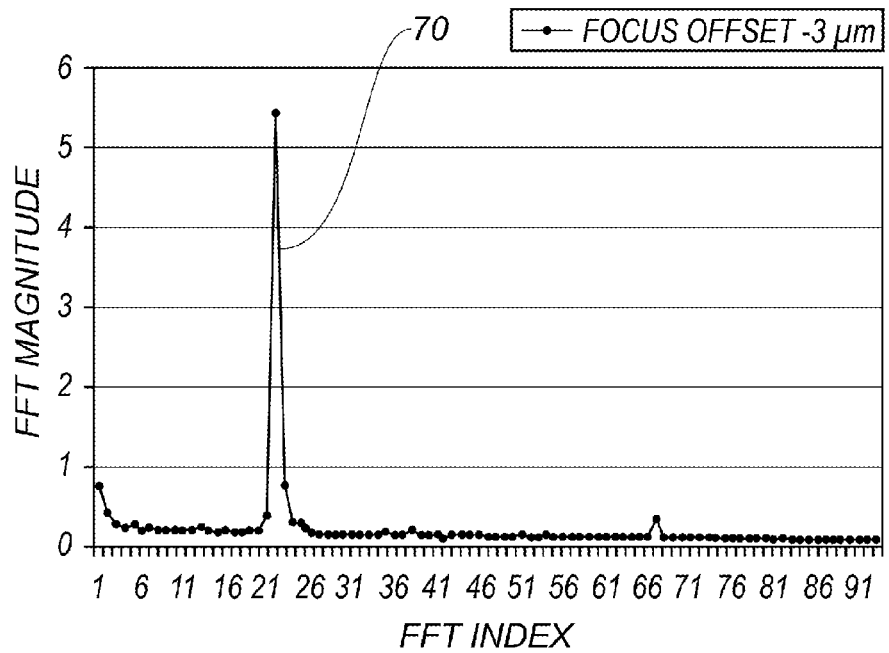
FIG. 6 shows an example of plot in the frequency domain created from scanned data generated from an image feature pattern formed as per an example embodiment of the invention.

FIG. 6 shows an example of plot in the frequency domain of the image feature pattern corresponding to the −3 micron focus offset value. The plot in FIG. 6 shows a predominate peak 70 which is related to the intensity of the banding in the image feature pattern 50 corresponding to the −3 focus offset value. The intensity of the banding can be represented by a quantified value which in this case is approximately 5.5 in the FFT magnitude scale. It should be noted that very little noise is present in the plot shown in FIG. 6. An appropriate selection of one or more of the sub-scan spatial frequency of the image features in each of the first and second sets of each image feature pattern 50, the sub-scan spatial frequency of the image swaths and the sampling spatial frequency employed by scanner 40 can be used to reduce noise levels in similar plots in the frequency domain. In some example embodiments, data 47 is analyzed in the frequency domain at a frequency value corresponding to the sub-scan spatial frequency of the image features in each of the first and second sets of each image feature pattern 50. In other example embodiments, data 47 is analyzed in the frequency domain at a frequency value corresponding to a harmonic of the sub-scan spatial frequency of the image features in each of the first and second sets of each image feature pattern 50.

Figure 7:
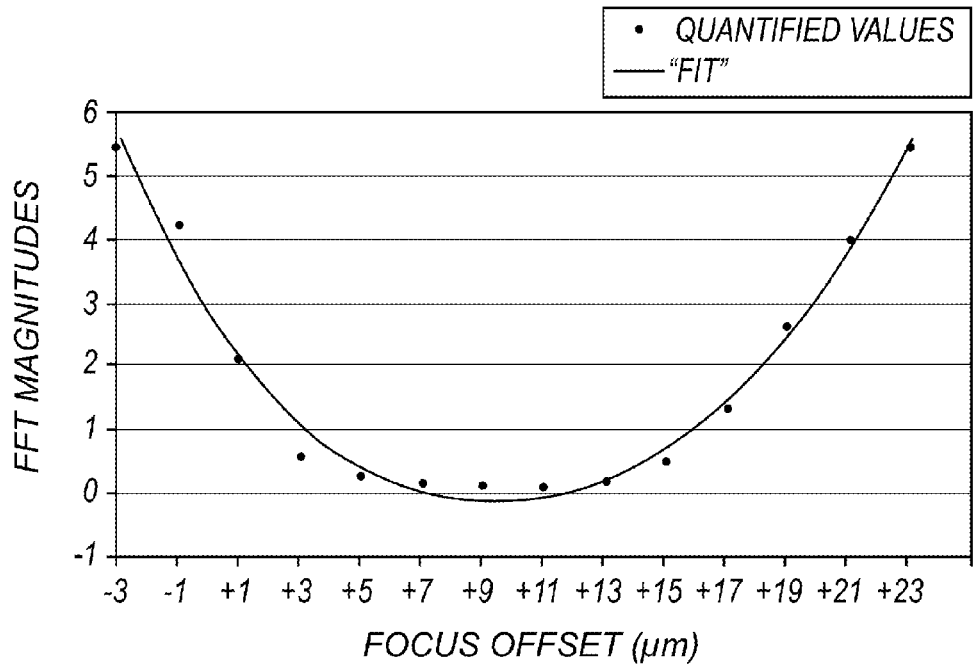
FIG. 7 shows a distribution of various quantified values determined for each of a plurality of different focus offset values according to an example embodiment of the invention.

In step 250 of method 200, the imaging parameter is adjusted at least in part from the quantified value derived in step 240. FIG. 7 shows a distribution of various quantified values determined for each of a plurality of different focus offset values according to an example embodiment of the invention. Each of the quantified values is shown correlated to a corresponding image parameter value which in this case is an overall focus value. Each of the parameter values is equal to an average of the plurality of parameter values used to form the different interleaved sets of image features corresponding to each of the image feature patterns 50. The FIG. 7 plot shows the individual quantified values as well as a line "FIT" which is a mathematical curve fit to the plotted quantified values. In this example embodiment, the curve "FIT" that is applied is a second order polynomial. The present inventors have also used other more involved relationships including $6^{th}$ order polynomials, but have found that these relationships are typically not necessary for this particular case.

The distribution of quantified values and the curve "FIT" show that the banding intensity progressively increases as a focus offset increases or decreases from a value of +9 microns. Accordingly, the focus offset value of +9 microns corresponds to an optimum set-point for the focus imaging parameter. The FIG. 7 plot indicates that there appears to be little difference between the measured optical densities corresponding to each of the bounding parameter values used to represent the +9 micron focus offset value. In this example embodiment of the invention, a focus parameter associated with recording apparatus 10 is set to +9 microns for a subsequent imaging. In various example embodiments of the invention, the imaging parameter may be adjusted in accordance with the identification of a minimum value among a distribution of the determined quantified values. In other example embodiments of the invention, the imaging parameter can be adjusted in accordance with inflection point in a mathematical curve fitted throughout a distribution of the quantified values.

It is to be noted that the "FIT" curve in the FIG. 7 plot dips below 0 at a focus offset value of +9 microns. This is a result of the curve fitting exercise only and not the actual quantified values generated in the frequency domain. The FIG. 7 plot also shows a focus offset distribution ranging from −3 microns to +23 microns whereas the image feature patterns 50 shown in FIG. 3A corresponded to a range of −9 microns to +9 microns. If the quantified values determined from analysis of the image pattern features 50 of FIG. 3A were plotted, an operator may not be able to positively ascertain an optimum focus value since all the values are generally declining in magnitude. Accordingly, the FIG. 7 plot corresponds to a second imaging of another recording media 17 formed with image feature patterns 50 having a focus offset distribution shifted in the positive direction from those shown in FIG. 3A.

Figure 8:
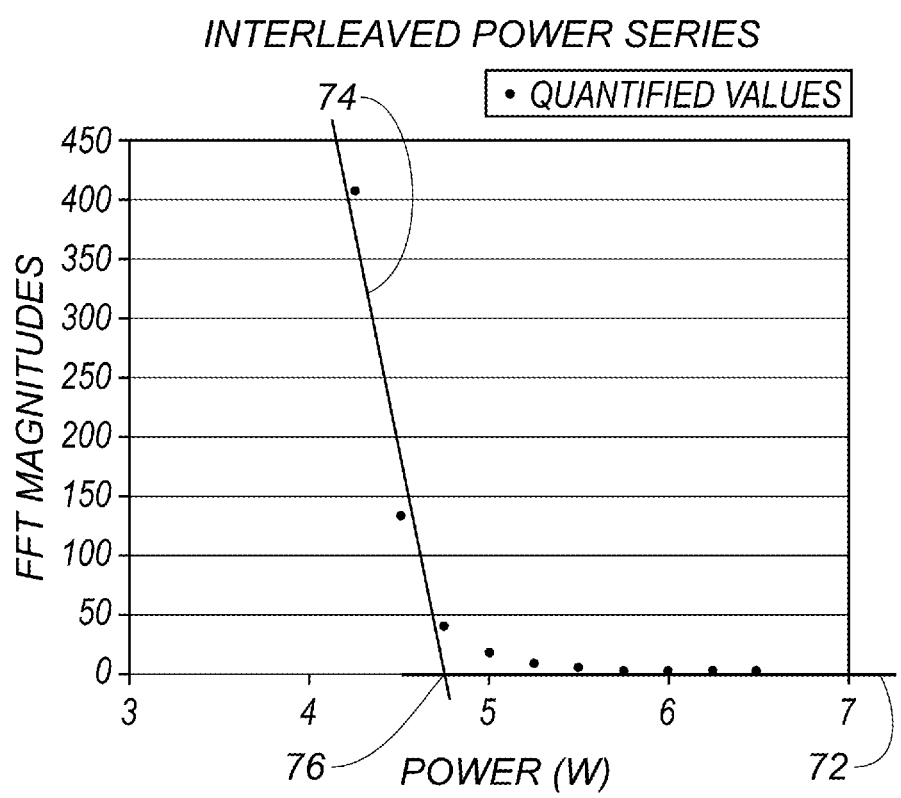
FIG. 8 shows a distribution of quantified values determined for each of a plurality of radiation source power levels according to an example embodiment of the invention.

Other imaging parameters can be adjusted in accordance with the present invention. FIG. 8 shows a plot of quantified values determined in frequency domain for an imaging parameter related to a power of a radiation source within recording head 16. In this example embodiment, a recording media 17 was again imaged with a number of image feature patterns, each of the image feature patterns corresponding to a particular power value. Each of the image feature patterns is formed by interleaving the image features in a first pattern of image features with the image features in a second pattern of the image features. The image features in each of the first and second patterns are formed in accordance with different power values which average to equal the particular power level represented in the corresponding image feature pattern. In various example embodiments, the spread between the bounding power levels and/or the spread between the power levels represented by each of the image feature patterns can be related to a particular recording media 17 that is to be imaged.

In one example embodiment, a spread between the power levels represented by each of the image feature patterns on the order of 6% from the overall power level of a first one of the image feature patterns can be employed with good results. For example the first image feature pattern can correspond to 4.250 W. Six percent of 4.250 W is 0.255 W and therefore the series of the image feature patterns would correspond to the following series of power levels: 4.250 W, 4.505 W, 4.760 W, 5.015 W, etc. In this case the spread between the bounding power levels (i.e. the interleaved power values) representative of the power level corresponding a particular image feature pattern is also selected to be +/−0.255 W. Accordingly, the image feature pattern corresponding to the 4.250 W power level would include a first set of interleaved image features formed at 3.995 W and a second set of interleaved image features formed at 4.505 W. In a similar manner, the image feature pattern corresponding to the 4.505 W power level would include a first set of interleaved image features formed at 4.250 W and a second set of interleaved image features formed at 4.760 W.

The FIG. 8 plot shows a number of quantified values determined in the frequency domain from data generated from a scanning of the image feature patterns formed on the recording media 17. The FIG. 8 plot shows that at underexposed powers the banding intensity is high as illustrated by the first few data points. The FIG. 8 plot additionally shows that as the level of exposure is increased with increasing powers, the banding intensity reduces and then plateaus. In this example embodiment, a set point for the power imaging parameter is determined by generating a best fit first line 72 through the "plateau" region of the plotted quantified values and a best fit second line 74 through the quantified values corresponding to the underexposed regions of the plot. The intersection point 76 between first line 72 and second line 74 represents the lowest exposure point of the recording media 17. From this a multiplier can be used to achieve a power set point.

In the example embodiment corresponding to the FIG. 8 plot, each of the image feature patterns is produced while media support 12 is rotated with a common rotational speed. Since the exposure of recording media 17 is related to this rotational speed, the determined power set-point may need to be recalculated if different imaging conditions that may require changes in this speed are required in the future.

The invention has been described in detail with particular reference to certain preferred embodiments thereof, but it will be understood that variations and modifications can be effected within the scope of the invention.

Parts List 10 recording apparatus
12 media support
13 cylindrical surface
16 recording head
17 recording media
18 carriage
19 calibration image
20 support
21 radiation beam
22 motion system
23 recording channels
25 registration features
28 clamps
30 controller
32 guide system
33 transmission member
35 auto-focus system
36 secondary laser source
37 image data
38 position sensitive detector
40 scanner
42 sensor array
45 matrix
46 data column
47 data
48 data row
50 image feature patterns
50A image feature pattern
60A first set of image features
60B second set of image features
70 peak
72 best fit first line
74 best fit second line
76 intersection
100 imaging and diagnostics system
200 method
210 form calibration image on recording media
220 adjust contrast between imaged and non-imaged regions
230 generate data from image recording media
240 analyze scanned data to determine a quantified value representative of banding
250 adjust imaging parameter based at least on the quantified value
300 Fast Fourier Transform (FFT) algorithm
310 select portion of scanned data matrix corresponding to one of the image feature patterns
320 calculate sum of squares for data in matrix portion
330 calculate FFT for each data row in matrix portion
340 derive a series of magnitude values for each FFT
350 square each of the magnitude values and sum squared values corresponding to a given data column
360 normalize squared and summed magnitude levels
MSA main-scan axis
SSA sub-scan axis
X direction
Y direction
M number
N number

The invention claimed is:

1. A method for adjusting an imaging parameter, comprising:
operating a recording head to form a first set of image features on a recording media, wherein each image feature in the first set of image features is formed while the imaging parameter is set to a first predetermined value;
operating the recording head to form a second set of image features on the recording media, wherein each image feature in the second set of image features is formed while the imaging parameter is set to a second predetermined value different from the first predetermined value;
interleaving image features of the first set of image features with image features of the second set of image features to form an interleaved pattern of image features on the recording media;
generating data from the interleaved pattern of image features formed on the recording media;
analyzing the data to determine a quantified value representative of banding in the interleaved pattern of image features; and
adjusting the imaging parameter based at least on the quantified value.

2. A method according to claim 1, wherein the data is grayscale data.

3. A method according to claim 1, wherein the imaging parameter is an intensity of a radiation beam emitted by the recording head.

4. A method according to claim 1, wherein the imaging parameter is a focus of a radiation beam emitted by the recording head.

5. A method according to claim 1, wherein the imaging parameter is a power of a source of radiation in the recording head.

6. A method according to claim 1, comprising forming each of the first set of image features and the second set of image features during a different scan of the recording head over the recording media.

7. A method according to claim 1, comprising operating the recording head to concurrently form at least one image feature in the first set of image features with at least one image feature in the second set of image features on the recording media.

8. A method according to claim 1, comprising selecting the first predetermined value and the second predetermined value such that an average of the first predetermined value and the second predetermined value is equal to a third predetermined value, wherein the method further comprises correlating the quantified value to the third predetermined value.

9. A method according to claim 8, comprising adjusting the imaging parameter based at least on the third predetermined value.

10. A method according to claim 1, wherein analyzing the data to determine the quantified value includes analyzing the data in the frequency domain.

11. A method according to claim 10, wherein the first set of image features and the second set of image features each forms a regular pattern of image features on the recording media, and the method comprises analyzing the data in the frequency domain at a frequency value corresponding to a spatial frequency of the image features in each of the regular patterns of image features.

12. A method according to claim 11, wherein the spatial frequency of the image features in each of the regular patterns of image features is a sub-scan spatial frequency, and the method comprises operating the recording head to form a regular pattern of image swaths while imaging the recording media, wherein one of a sub-scan spatial frequency of the image swaths in the regular pattern of image swaths and the sub-scan spatial frequency of the image features in each of the regular patterns of image features is equal to a non-integer multiple of the other of the sub-scan spatial frequency of the image swaths in the regular pattern of image swaths and the sub-scan spatial frequency of the image features in each of the regular patterns of image features.

13. A method according to claim 10, wherein the first set of image features and the second set of image features each forms a regular pattern of image features on the recording media, and the method comprises analyzing the data in the frequency domain at a frequency value corresponding to a harmonic of a spatial frequency of the image features in each of the regular patterns of image features.

14. A method according to claim 1, wherein the interleaved pattern of image features is one a plurality of interleaved patterns of image features formed on the recording media, wherein each of the interleaved patterns of image features is formed in accordance with a different set of predetermined imaging parameter values, and the method comprises:
 generating a plurality of data arrangements, each data arrangement being generated from a different one of the interleaved patterns of image features formed on the recording media;
 analyzing each data arrangement to determine a member within a group of quantified values, wherein each member within the group of quantified values is representative of banding in a corresponding one of the interleaved patterns of image features; and
 adjusting the imaging parameter based at least on the group of quantified values.

15. A method according to claim 14, comprising adjusting the imaging parameter based at least on a minimum value determined from the group of the quantified values.

16. A method according to claim 14, comprising adjusting the imaging parameter based at least on an inflection point in a mathematical curve derived from a distribution of the members of the group of quantified values.

17. A method according to claim 1, comprising providing a scanner adapted for generating the data from the interleaved pattern of image features formed on the recording media.

18. A method according to claim 17, wherein each image feature in the first set of image features and each image feature in the second set of image features is an elongate image feature extending along a first direction, and the data is generated by operating the scanner to scan over the recording media along a second direction that intersects the first direction.

19. A method according to claim 1, comprising adjusting a contrast between an imaged region of the recording media and an un-imaged region of the recording media prior to generating the data from the interleaved pattern of image features formed on the recording media.

\* \* \* \* \*